United States Patent
Tung

[11] Patent Number: 6,140,196
[45] Date of Patent: Oct. 31, 2000

[54] METHOD OF FABRICATING HIGH POWER BIPOLAR JUNCTION TRANSISTOR

[75] Inventor: Ming-Tsung Tung, Hsinchu Hsien, Taiwan

[73] Assignee: United Microelectronics Corp., Hsinchu, Taiwan

[21] Appl. No.: 09/203,711

[22] Filed: Dec. 2, 1998

[51] Int. Cl.[7] .................................................. H01L 21/331
[52] U.S. Cl. ...................... 438/341; 438/309; 438/312; 438/361; 438/363; 438/413
[58] Field of Search ..................................... 438/309, 341, 438/353, 700, 330, 430, 442, 429, 312, 361, 362, 363, 365, 366, 369, 370, 413

[56] References Cited

U.S. PATENT DOCUMENTS 5,057,443  10/1991  Hutter ........................................ 438/330

*Primary Examiner*—Jey Tsai
*Assistant Examiner*—Christopher Lattin
*Attorney, Agent, or Firm*—Jiawei Huang; J.C. Patents

[57] ABSTRACT

A method of fabricating a high power bipolar junction transistor. A P-type substrate having an N-type buried region is provided and a trench is formed within the substrate to expose the buried region. N-type ions are implanted and driven into the sidewall of the trench to form a sinker. Since the area and the depth of implantation are larger and deeper than that in prior art, the concentration of the sinker is more uniform and the diffusion range is easily controlled. An N-type epitaxial layer is then formed in the trench and an emitter, a base and their contacts are formed by conventional technique.

12 Claims, 4 Drawing Sheets

METHOD OF FABRICATING HIGH POWER BIPOLAR JUNCTION TRANSISTOR

BACKGROUND OF THE INVENTION

1. Field of the Invention

The invention relates to a method of fabricating a high power bipolar junction transistor (BJT), and more particularly to a method of fabricating a high power bipolar junction transistor that has a sinker of uniform concentration of collector and for the purpose of reducing device area.

2. Description of the Related Art

A bipolar junction transistor is an electronic device that uses both carriers of electrons and holes during operation so that the carrier mobility is faster than that in MOS. BJT is therefore applied on several special devices, such as high voltage device, high-speed logic circuit and high power device.

FIG. 1 is a schematic, cross-sectional illustration of a BJT as known in prior art. An $N^+$ buried region 102 is formed on a P-type substrate 100 to act as a collector of the BJT and an N-type epitaxial silicon 104 is formed on the substrate 100. An $N^+$ sinker region 106 is next formed by implanting and driving ions to the epitaxial silicon 104 surface, so that the sinker region 106 is electrically connected to the buried region 102. The step of forming a P-type base 108 is performed and the base 108 is formed within the epitaxial silicon 104 surrounded by the sinker region 106. An N-type emitter 110, a contact region 112 within the sinker region 106 of the collector 102 and a P-type contact region 114 of the base 108 are formed.

Since the sinker region 106 is formed by ion implantation on the surface of the epitaxial silicon 104 and then thermal drive-in, the concentration profile of the sinker region 106 is not uniform in the vertical direction and this situation becomes more serious as the depth of the sinker region 106 increases. Therefore, higher series resistance between buried region 102 and sinker 106 is easily induced, which influences the carrier mobility. Additionally, the ions in the sinker region 106 are diffused by drive-in and this makes the region 106 expand outwardly. Therefore, it is necessary to increase the desired area of the BJT to the point where it is no longer suitable for highly integrated devices.

SUMMARY OF THE INVENTION

It is therefore an object of the invention to provide a method of fabricating a high power BJT, which has a sinker with a uniform concentration profile to reduce the series resistance between the sinker and the buried region. The sinker is formed by lateral ion implantation and ions in the sinker don't diffuse outwardly to increase the device area.

To achieve these objects and advantages, and in accordance with the purpose of the invention, as embodied and broadly described herein, the invention is directed towards a method of fabricating a high power bipolar junction transistor. A P-type substrate having an N-type buried region is provided and a trench is formed within the substrate to expose the buried region. N-type ions are implanted and driven-in the sidewall of the trench to form a sinker. Since the area and the depth of implantation are larger and deeper than that in prior art, the concentration of the sinker is more uniform and the diffusion range is easily controlled. An N-type epitaxial layer is then formed in the trench and an emitter, a base and their contacts are formed by conventional techniques.

It is to be understood that both the foregoing general description and the following detailed description are exemplary and explanatory only and are not restrictive of the invention, as claimed.

DESCRIPTION OF THE PREFERRED EMBODIMENTS

The sinker of the conventional high power BJT is formed by implanting and driving ions into the surface of the substrate. However, the nonuniform ion concentration profile in the sinker becomes more serious when the sinker is deeper, such that the movement of carriers is not stable. The ions in the sinker diffuse laterally and outwardly due to the driving-in step and the area of the BJT increases. Therefore, a sinker in this invention is formed by forming a trench within an epitaxial layer on a buried region to expose the sidewall of the epitaxial layer and then implanting the ions into the sidewall. A sinker with a uniform concentration profile is thus obtained and the lateral range of the sinker is easily controlled.

FIGS. 2A–2G are schematic, cross-sectional views illustrating the fabrication process for a high power BJT in accordance with this invention. The fabrication of a power BJT of this invention is applied on a semiconductor silicon substrate of a first conductive type. The substrate includes P-type or N-type and P-type substrate is taken an example in this invention.

Figure 1:
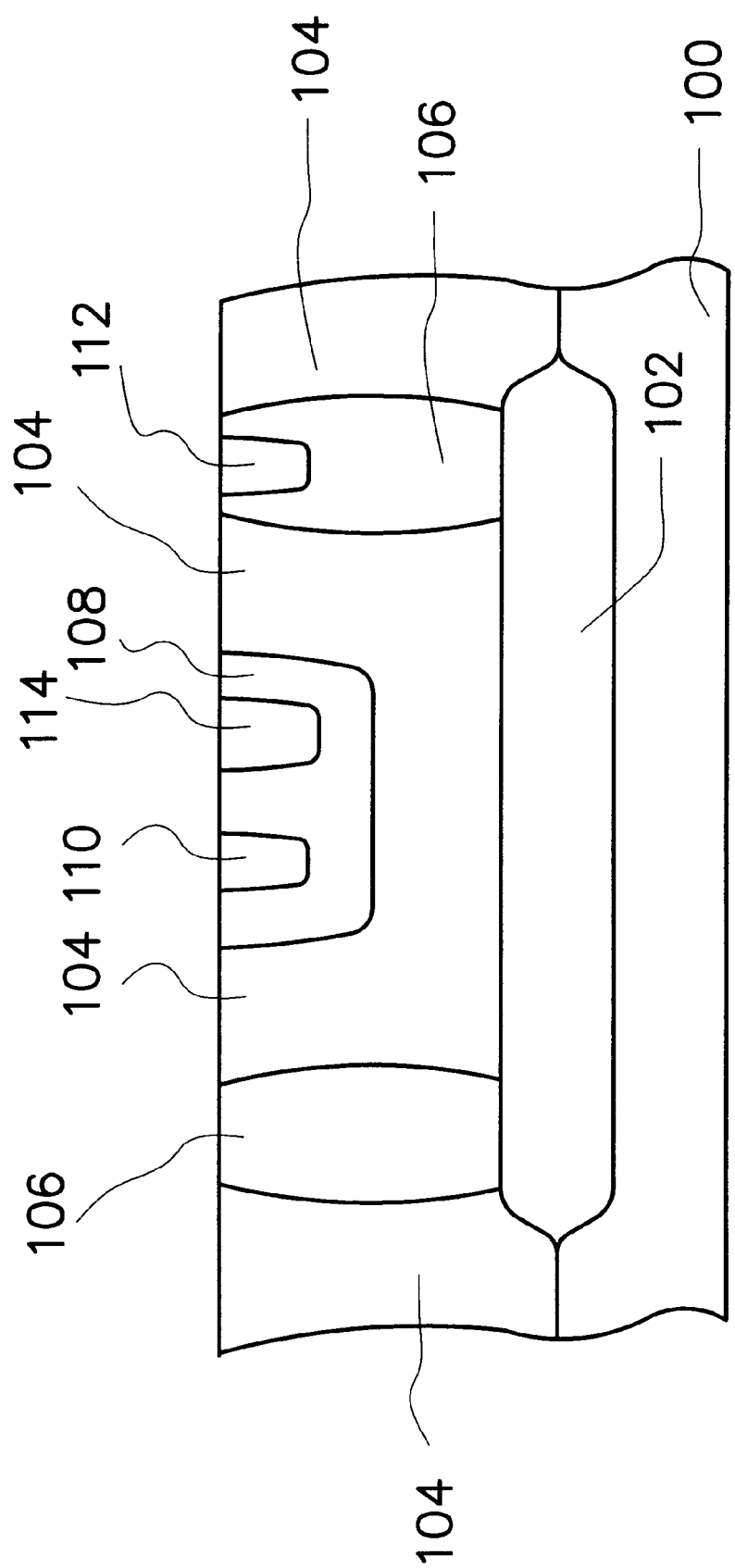
FIG. 1 is a schematic, cross-sectional view of a power BJT according to the prior art.
Figure 2A:
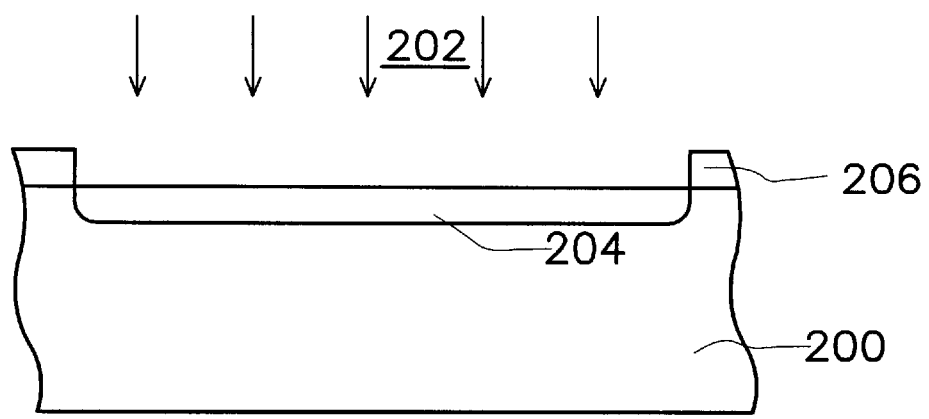
FIGS. 2A–2G are schematic, cross-sectional views illustrating the fabrication process for a high power BJT in accordance with this invention.

Referring to FIG. 2A, a silicon substrate 200 of a first conductive type dopant is provided and a mask 206 is formed on the silicon substrate 200 by photolithography. The mask 206 includes a silicon oxide layer formed by chemical vapor deposition (CVD) or thermal oxidation. Ions 202, for example, N-type ions 202, are selectively implanted into the silicon substrate 200 to form a buried region 204, for example, an N-type buried region, to serve as a collector of the BJT.

Figure 2B:
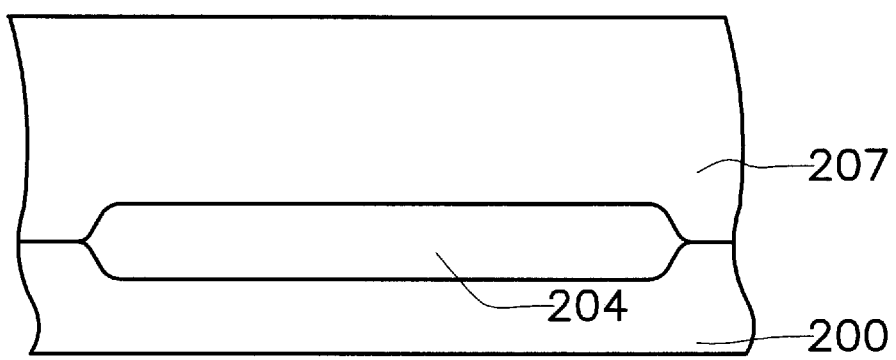

As shown in FIG. 2B, an epitaxial silicon layer 207 of the first conductive type is formed on the silicon substrate 200. The epitaxial layer 207 is formed by CVD and source gases includes silicon tetrachloride or dicholosilane. As the process is performed, a gas having P-type ions is added into the chamber with a concentration of about $10^{12}$–$10^{20}$ atoms/$cm^3$. It is necessary to precisely control the system conditions to form the epitaxial layer 207, so that the silicon atoms are able to have enough energy until they reach the substrate 200 surface and are deposited in orientation to the silicon substrate 200. The temperature in the process is more important than other system parameters.

Figure 2C:
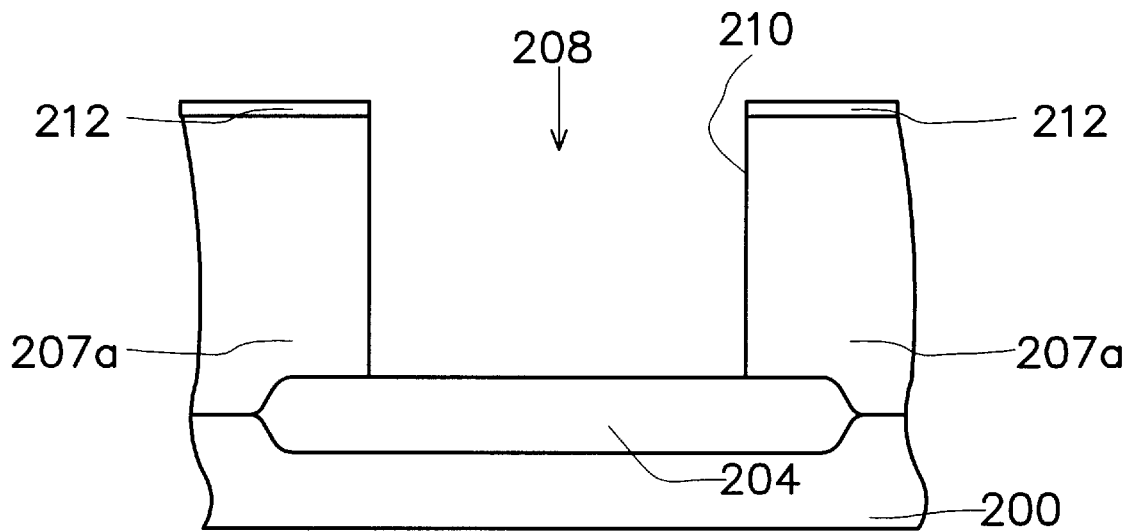

Referring to FIG. 2C, a trench 208 is then formed within the epitaxial layer 207 to expose the buried region 204 and a portion of the sidewall 210 of the epitaxial layer 207. For example, a mask layer 212 with an opening is formed on the epitaxial layer 207 and the mask layer 212 can be an oxide layer formed by thermal oxidation. Using the oxide layer 212 as a mask, the epitaxial layer 207 is anisotropically etched to form the trench 208.

Figure 2D:
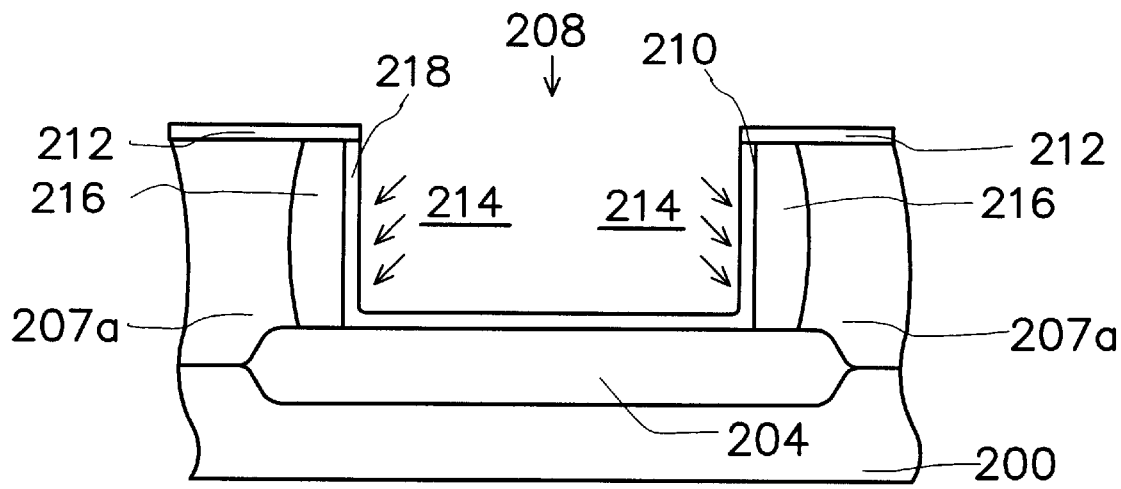

As shown in FIG. 2D, using the mask layer 212 as an implantation mask, ions 214 of a second conductive type are implanted into the sidewalls 210 of the exposed epitaxial layer 207a to form a sinker 216. It is necessary to perform a drive-in step while the ions are implanted and the ions are thus diffused uniformly. The sidewalls 212 and the depth provided for ion implantation are larger and deeper, therefore the ion concentration in the sinker 216 is more uniform than that in the prior art and the diffusion area of ions is easily controlled. An oxide layer 218 is naturally grown on the sidewalls 210 and the surface of the buried region 204 prior to the step of drive-in. The oxide layer 218 grown on the surface of the buried region 204 has to be removed by a process such as dry etching, the oxide layer 218 on the sidewalls 210 is left and the subsequent process can be continued without interruption.

For example, using the mask layer 212 including an oxide layer as a mask, N-type ions are implanted into the sidewalls 210 and the mask layer 212 can prevent ions from being implanted into the surface of the epitaxial layer 207a. The oxide layer 218 formed on the sidewalls 210 has an insulation effect in the subsequent processes but its formation on the buried region 204 is undesirable. The oxide layer 218 formed on the buried region is therefore anisotropically etched while the oxide layer 212 serves as a mask, and the oxide layer 218 on the sidewalls 210 is left.

Figure 2E:
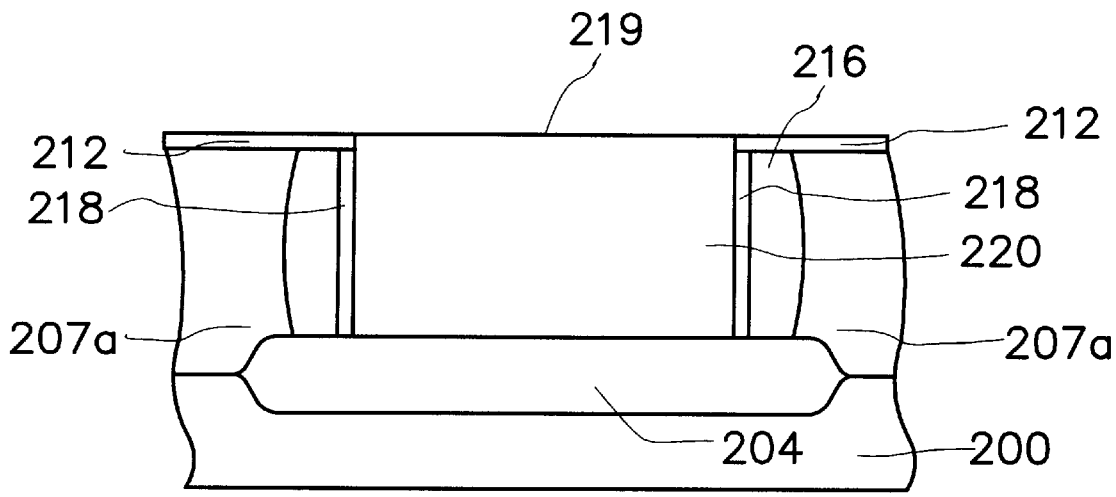

Referring to FIG. 2E, an epitaxial layer 220 of the second conductive type is formed on the buried region 204 in the trench 208, and the upper surface 219 of the epitaxial layer 220 is level with the mask layer. For example, $SiCl_4$, $SiCl_2H_2$ and a gas having N-type ions are pumped into a chamber to form an N-type epitaxial layer. The sinker 216 and the epitaxial layer 220 are isolated by the oxide layer 218 formed on the sidewalls 210 and as a result, the width of the trench 208 of FIG. 2D can be reduced to shrink the dimensions of the BJT.

Figure 2F:
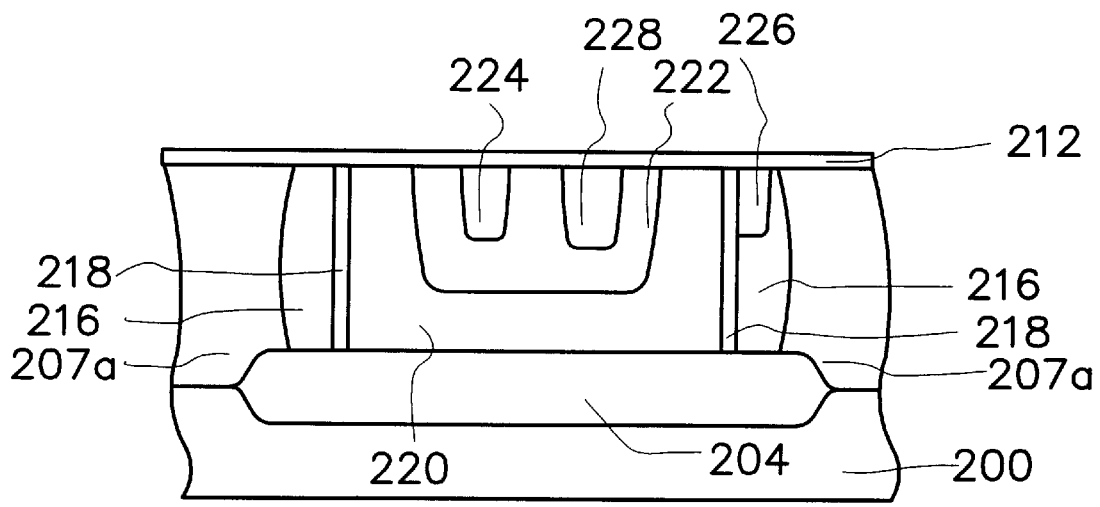

As shown in FIG. 2F, a well 222 of the first conductive type is formed within the epitaxial layer 220 to serve as a base of the BJT. A doped region of the second conductive type is formed within the base 222 to serve as an emitter 224, and a doped region of the second conductive type is formed within the sinker 216 to serve as a contact region 226 of the collector 216. A doped region of the first conductive type is formed within the base 222 to serve as a contact region 228 thereof and the emitter 224 is isolated with the contact region 228 by the base 222.

For example, a P-type base mask (not shown) is formed on the wafer and P-type ions are implanted and then driven into the epitaxial layer 220 to form a well serving as a base 222. The P-type base mask is then removed. A $N^+$ mask (not shown) is formed on the wafer to implant N-type ions into the well 222 and the sinker 216 to form a $N^+$ emitter 224 and a contact region 226 of the collector 204, respectively. The $N^+$ mask is next removed and a $P^+$ base contact mask (not shown) is formed on the wafer. P-type ions are implanted and driven in to form a doped region to serve as a contact region 228 of the base 222.

Figure 2G:
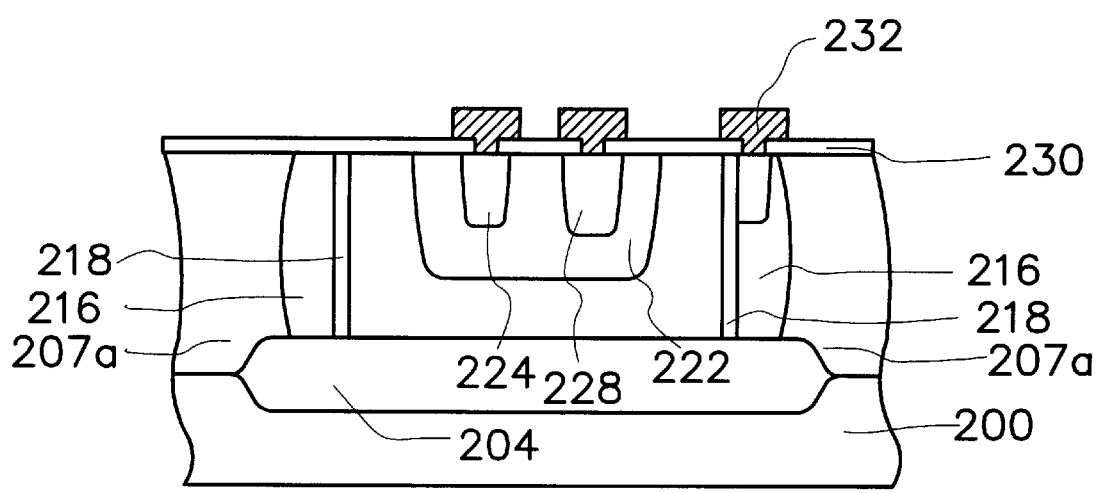

Referring to FIG. 2G, a dielectric layer 230 such as an oxide layer is formed on the wafer by CVD. The dielectric layer 230 is then patterned to form contact windows. A conductive layer is deposited and defined to form contacts 232 to electrically connect to the emitter 224, the contact region 228 of the base 222 and the contact 226 region of the collector 204.

As described above in the preferred embodiment, a trench is formed within the epitaxial layer on the buried region to expose the sidewalls of the epitaxial layer, and then ion implantation and drive-in are performed on the sidewalls to form a sinker to electrically connect to the collector of the epitaxial layer. The ion concentration in the sinker is thus uniform and the series resistance between the sinker and the collector can be reduced. In addition, since the sinker is formed by lateral implantation, the lateral diffusion area is easily controlled and the dimension of the BJT is therefore reduced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a high power bipolar junction transistor, comprising:

providing a substrate of a first conductive type wherein the substrate comprises a buried region of the second conductive type to serve as a collector of a transistor wherein the second conductive type is opposite in polarity to the first conductive type;

forming a trench within the substrate to expose the buried region wherein the substrate has a sidewall;

forming a sinker of the second conductive type in the substrate sidewall;

forming a first epitaxial layer of the second conductive type in the trench, wherein an upper surface of the first epitaxial layer is level with the substrate;

forming a base of the first conductive type within the first epitaxial layer wherein a contact region of the base of the first conductive type is formed within the base; and forming an emitter of the second conductive type within the base and forming a contact region of the first conductive type of the collector within the sinker.

2. The method according to claim 1, wherein provision of a substrate of a first conductive type having a buried region further comprises:

providing a silicon substrate of the first conductive type;

forming a mask layer with an opening on the silicon substrate;

forming the buried region of the second conductive type within the silicon substrate by performing ion implantation on the silicon substrate while using the mask layer as a mask;

removing the mask layer; and forming a second epitaxial layer of the first conductive type on the buried region to form the substrate comprising the buried region.

3. The method according to claim 2, wherein the mask layer includes an oxide layer.

4. The method according to claim 1, wherein the emitter is isolated with the contact region of the base by the base.

5. The method according to claim 1, wherein the first conductive type is P-type and the second conductive type is N-type.

6. The method according to claim 1, wherein the first conductive type is N-type and the second conductive type is P-type.

7. A method of fabricating a high power bipolar junction transistor, comprising:

providing a silicon substrate with a first conductive type wherein a buried region of a second conductive type opposite in polarity to the first type conductivity is formed within the silicon substrate to serve as a collector of a transistor;

forming a first epitaxial layer of the first conductive type on the silicon substrate;

forming a mask layer having an opening on the first epitaxial layer;

forming a trench within the first epitaxial layer to expose the buried region wherein the first epitaxial layer has a sidewall;

implanting and driving ions of the second conductive type into the sidewall of the first epitaxial layer to form a sinker wherein an oxide layer is grown on the sidewall and the buried region;

removing the oxide layer grown on the buried region;

forming a second epitaxial layer of the second conductive type in the trench wherein an upper surface of the second epitaxial layer has the same level with the first epitaxial layer;

forming a base with the first conductive type within the second epitaxial layer wherein a first doped region of the first conductive type is formed within the base to serve as a contact region of the base; and forming a second doped region of the second conductive type within the base to serve as a emitter and forming a third doped region of the first conductive type within the sinker to serve as a contact region of the collector.

8. The method according to claim 7, wherein the mask layer includes an oxide layer.

9. The method according to claim 7, wherein the emitter and the contact region of the base are isolated by the base.

10. The method according to claim 7, wherein the first conductive type is P-type and the second conductive type is N-type.

11. The method according to claim 7, wherein the first conductive type is N-type and the second conductive type is P-type.

12. The method according to claim 7, wherein the step of removing the oxide layer includes dry etching.

* * * * *